United States Patent [19]

Nelson et al.

[11] Patent Number: 4,528,213

[45] Date of Patent: Jul. 9, 1985

[54] EMI/RFI SHIELDING COMPOSITION

[75] Inventors: Jordan R. Nelson, Pennington; Bruce F. Bogner, Mt. Holly, both of N.J.

[73] Assignee: RCA Corporation, Princeton, N.J.

[21] Appl. No.: 554,339

[22] Filed: Nov. 22, 1983

[51] Int. Cl.³ .............................. B05D 5/12; H01B 1/06
[52] U.S. Cl. ..................................... 427/105; 427/122; 252/506; 252/511; 524/495; 524/496
[58] Field of Search ................ 252/506, 511; 524/495, 524/496; 427/105, 122; 264/105

[56] References Cited

U.S. PATENT DOCUMENTS

| | | | |
|---|---|---|---|
| 4,228,050 | 11/1980 | Martin et al. | 260/23 XA |
| 4,382,981 | 5/1983 | Stoetzer et al. | 427/105 |
| 4,396,795 | 8/1983 | Bogner | 174/35 R |
| 4,414,425 | 11/1983 | Bogner | 174/35 GC |
| 4,421,678 | 12/1983 | Mehta | 252/511 |
| 4,474,676 | 10/1984 | Ishino et al. | 252/62.54 |
| 4,474,685 | 10/1984 | Annis | 252/503 |

FOREIGN PATENT DOCUMENTS

| | | |
|---|---|---|
| 0032375 | 7/1981 | European Pat. Off. |
| 0109824 | 5/1984 | European Pat. Off. |
| 52-42295 | 4/1977 | Japan ................................. 524/496 |
| 1296855 | 11/1972 | United Kingdom |
| 1352107 | 5/1974 | United Kingdom |
| 1528555 | 10/1978 | United Kingdom |
| 2046274 | 11/1980 | United Kingdom |

OTHER PUBLICATIONS

Kirkland, Plastics Technology, Sep. 1983, pp. 59–61.
Modern Plastics, Jun. 1982, p. 58.
Dreger, Machine Design, Jan. 6, 1983, pp. 79–85.
Modern Plastics, Sep. 1981, p. 114.
Simon, Modern Plastics, Aug. 1983, pp. 78–80.
Rubber Chemistry and Technology, vol. 54, No. 4–Sep.–Oct. 1981, pp. 820–834.

*Primary Examiner*—Norman Morgenstern
*Assistant Examiner*—Ken Jaconetty
*Attorney, Agent, or Firm*—Birgit E. Morris; R. Hain Swope

[57] ABSTRACT

A composition providing effective electromagnetic/radio frequency interference (EMI/RFI) shielding is disclosed. The composition comprises a plastic material, preferably a thermoplastic resin, suitable additives such as lubricants, stabilizers and the like, and a conductive component consisting of a mixture of finely divided conductive carbon black and graphite.

9 Claims, No Drawings

EMI/RFI SHIELDING COMPOSITION

This invention relates to a composition for shielding electronic equipment from electromagnetic/radio frequency interference.

BACKGROUND OF THE INVENTION

One of the principal advantages of plastics, their lack of conductivity, has become a major disadvantage for certain applications. Because plastics, which are extensively used in the construction, housing and packaging of electronic equipment, are insulators, they do not shield such equipment from electromagnetic/radio frequency interference ("EMI/RFI") from outside sources. Stray electromagnetic signals can adversely affect sensitive electronic equipment such as computers, navigational instruments, process controls, communication equipment and the like.

In an effort to prepare a truly effective EMI/RFI shielding material, a variety of finely divided conductive substances have been dispersed in plastics to render them conductive. A representative list of such materials includes aluminum flakes, silver flakes, metal-coated carbon fibers, stainless steel fibers, carbon black, nickel-coated graphite, silver-coated copper and the like.

The amount of a given conductive material which can be dispersed into a plastic resin to form an EMI/RFI shielding material is usually limited by the effect thereof on the melt viscosity of the filled resin and other factors such as workability of the material, brittleness and adhesiveness of coatings or sheets made therefrom, and the like. Melt viscosity is a primary criterion for the usefulness of a composition as a shielding material.

Melt viscosity is critical because, in many instances, shielding material must be moldable. Incorporating particulate or finely divided conductive substances into thermoplastic resins can increase the melt viscosity to where they will not fill the mold. Raising the molding temperature to compensate for this is only effective to the point where thermal degradation of the polymer must be considered. While a comparatively greater amount of conductive material can be incorporated into certain thermoset substances such as rubber, the poor qualities of the resulting composition in terms of workability make them substantially less desirable than filled thermoplastic resins such as poly(vinyl chloride).

A major disadvantage of the EMI/RFI shielding compositions known at present is that they suffer a loss of effectiveness if there is a gap or opening in their protective coating. With a metal coating, for example, a small slit or crack in the coating will cause the shielding value to drop to almost zero. In other words, they are effective if they completely enclose an electronic device. This, of course, is usually not possible because of the design of the device or its housing. Even overlapping sheets of conductive shielding is not effective in preventing leakage of radiation which escapes at the edge of the sheets. It may be necessary to provide a gasket at the interface of two shielding sheets, such as is described by Bogner in U.S. Pat. Nos. 4,396,795 and 4,414,425 because radiation, even though it can't go through sheets of such material, will go around them.

In accordance with this invention, a composition is provided which is very effective as EMI/RFI shielding material and which can tolerate a discontinuity in a protective coating made therefrom without total loss of effectiveness.

BRIEF SUMMARY OF THE INVENTION

A composition suitable for the preparation of EMI/RFI shielding is provided which comprises the combination of finely divided conductive carbon black and graphite dispersed in a thermoplastic resin.

DETAILED DESCRIPTION OF THE INVENTION

The unit measurement for shielding effectiveness of EMI/RFI shielding material is decibels (dB) of attenuation. Attenuation is defined as a function of electrical conductivity and absorption of shielding materials at various frequencies. A value of 10–30 dB is considered a minimum meaningful shielding range; 30–60 dB is normal shielding; and 60–90 dB is above average shielding. As a practical matter, it is generally considered that 30–40 dB shielding is adequate protection in 95 percent of commercial, i.e. nonmilitary/aerospace, applications. Shielding prepared from the subject compositions is effective in the 30–40 dB range without sacrifice of any significant property, particularly melt viscosity.

The plastic component of the subject compositions is preferably a thermoplastic resin although certain thermoset resins, particularly epoxy, polyester and urethane resins, can be utilized. Suitable thermoplastic resins include, but are not limited to, vinyl, acrylic, alkyd, urethane, polyester and hydrocarbon resins. Homopolymers or copolymers of vinyl chloride are particularly preferred for certain applications. The choice of a resin will be controlled by factors such as, for example, the temperatures it will be subjected to in operation of a device, or how the composition will be applied to the device, e.g. as sheets, molding and the like. The plastic resin comprises from about 64 to about 78, preferably from about 66 to 72, percent by weight of the subject compositions.

The subject compositions generally contain up to ten percent by weight of conventional modifiers, e.g. plasticizers, stabilizers, lubricants, processing aids and the like. Conventionally, most plastic compositions contain an additive component comprising up to about ten percent by weight and consisting of an internal lubricant, an external lubricant and a stabilizer. Each of these can be a single ingredient or a combination of two or more. The choice of a particular modifier or group of modifiers will depend on the resin utilized as well as the mode of application and use conditions of the shielding material.

Suitable stabilizers include, for example, organo-metallic compounds containing tin, lead, zinc, barium or cadmium, epoxides, phosphites, alkylated phenols and the like, with organo-tin compounds being generally preferred. Solid lubricants include mixed organic ester preparations, stearic acid, its esters, metallic salts, and the like. The subject compositions may also contain processing aids such as an acrylic flow modifer, plasticizers such as diundecyl phthalate and the like.

The conductive component of the subject compositions is a combination of finely divided conductive carbon black and graphite Both of these materials have been used individually in EMI/RFI shielding compositions. However, they have not heretofore been combined and the enhanced shielding effect achieved by combining them could not have been reasonably predicted. The subject compositions contain from about 10 to about 17, preferably from about 12 to about 16, percent by weight of conductive carbon black and from about 5 to about 15, preferably about 10 percent by weight, of graphite.

The conductive carbon black utilized in the subject EMI/RFI shielding compositions is preferably a low bulk density, highly conductive carbon black such as Ketjenblack EC of the Armak Company, Conductex 40-220 of the Columbian Chemical Company, CSX-200A of Cabot Carbon Company and the like. These conductive blacks have an apparent bulk density of about 150 grams per liter, a high surface area, and a high proportion of voids within the particles as measured by dibutylphthalate absorption. The percentages of carbon black content contemplated herein are based on a highly porous black such as described above. Denser, nonporous conductive carbon blacks can be used in the practice of this invention. However, such blacks will require a higher loading, i.e. up to about 30 percent by weight, to achieve the same degree of shielding. For example, an 0.07 inch thick sheet having a composition such as described herein has an effective shielding of about 23 dB with about 14 percent by weight of a highly porous, conductive carbon black or about 27 percent by weight of a solid, nonporous conductive carbon black in a poly(vinyl chloride)-based resin.

The particle size of the conductive carbon black utilized in the subject shielding compositions should be sufficiently fine so that a highly conductive, homogeneous dispersion in the plastic can be produced. Generally, the conductive carbon black should have an average particle size of under 45 nanometers and preferably under 25 nanometers. It will be appreciated that the maximum amount of a given conductive carbon black which can be incorporated into a plastic resin composition in accordance with this invention will depend primarily on the effect thereof on the melt viscosity of the final composition.

The graphite utilized in the shielding compositions of this invention is any commercial grade graphite having an average particle size of about one micrometer. A suitable graphite is available from Ultra Carbon Corporation of Bay City, Michigan under the designation UCPR-1-M.

Particularly suitable compositions for EMI/RFI shielding in accordance with this invention are prepared by blending graphite into conductive molding compositions utilized to prepare capacitive electronic discs ("CED"s). Such molding compositions and their preparation are disclosed by Martin et al. in U.S. Pat. No. 4,228,050, Oct. 14, 1980, the disclosure of which is incorporated herein by reference. The use of such material to provide EMI/RFI shielding in accordance with this invention is advantageous in that it provides a utility for scrap CED material which otherwise might have been discarded, e.g. flashing trimmed from finished discs. Such material is heated to melt the plastic composition and the graphite thoroughly blended therein. The resulting mixture is allowed to cool to ambient and then further processed, e.g., by extruding and pelletizing. The resulting composition may be stored, molded into sheets or further processed in accordance with conventional procedures for EMI/RFI plastic shielding compositions.

When a CED composition is not utilized in preparing the subject compositions, they may be prepared by thoroughly blending the conductive carbon black particles with the graphite and the remaining dry ingredients. Liquid ingredients, if any, are added after the dry ingredients have been initially blended until the temperature reaches about 170° F. The mixture is again blended until the temperature reaches about 230° F. The mixture is then allowed to cool. The composition may then be charged to a suitable apparatus to melt the ingredients under shear. The molten mixture may be coated directly onto housing for electronic equipment, molded into sheets for future use, extruded and pelletized for future use or further processed in accordance with conventional procedures.

The subject compositions are particularly advantageous in the amount of shielding protection provided without appreciable loss of critical properties such as melt viscosity, workability and the like. For example, a composition containing about 15 percent by weight conductive carbon black in a poly(vinyl chloride)resin-based composition which is acceptable in terms of properties such as melt viscosity, workability and the like has a dB rating of 23 for a 0.07 inch thick molded sheet. The addition of 10 percent by weight of graphite thereto raises the dB of the same sheet to approximately 35 without loss of desirable properties.

The increase in melt viscosity resulting from adding graphite at 5, 10 and 15 percent by weight, respectively, to a poly(vinyl chloride)-based composition containing 13.5 percent by weight Ketjenblack EC conductive carbon black is very slight, amounting to a shear stress increase in psi of from about 17 to about 20. The increase in dB for the same composition, however, is from 23 to 34. In contrast, similar compositions containing 10 percent by weight of graphite to which was added 10, 12 and 15 percent by weight, respectively, of the same conductive carbon black, showed an increase in shear stress of 13 psi, i.e. from about 7 to about 20, with a dB increase of only 10 dB. The properties of the subject shielding compositions are considered unexpected in view thereof.

The fact that the subject shielding compositions provide a high degree of protection per unit of shielding thickness is significant in terms of the relative amount required in comparison with other shielding compositions to obtain the same degree of protection. The fact that thinner coatings of the subject material are required for adequate shielding is also important with regard to the space required within the electronic device for such shielding.

Another distinct advantage of the subject compositions is that they can be used in devices wherein the continuity of the shielding is interrupted such as a capacitive type videodisc player which has a slot for insertion of the disc. Wherein such a device is shielded with conventional materials, such an interruption would reduce the protection almost to zero. It has been found that a coating of the subject shielding compositions on the flap that covers and slightly overhangs the slot in a CED player will produce adequate protection when the flap is covering the slot.

Further, there is no need to gasket seams with the subject compositions as is often necessary with conventional shielding materials to obtain maximum efficiency. The exact chemical or mechanical explanation for this is not known with certainty. It is known, however, that the shielding prepared from the subject compositions, in contrast to most conventional shielding materials which merely reflect the radiation back to its origin, both reflects and absorbs radiation. That the shielding of this invention absorbs EMI/RFI radiation is believed responsible for its enhanced efficiency.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

The following were blended until homogeneous in a Welex mixer: 71.25 parts of Geon 110×346 poly(vinyl chloride) resin of the B. F. Goodrich Co., having a weight average molecular weight of 46,200, a number average molecular weight of 23,300 and a Tg of 80°; 1.5 parts of T-35 stabilizer of M & T Chemical Company; 0.25 part of Loxiol G-70 and 0.50 part of Loxiol G-30, lubricants of Henkel International GmbH; 1.0 part of calcium stearate lubricant, 13.5 parts of conductive carbon black Ketjenblack EC having an average particle size of 35 nanometers, and 10.0 parts of Ultra Carbon graphite UCPR-1-M having an average particle size of about 1 micrometer. Two parts of diundecyl phthalate liquid plasticizer were sprayed onto the mixture and mixing was continued until the temperature of the mixture reached 113°. The mixture was cooled to ambient and fed to a Buss Condux Kneading extruder and melt-extruded in the form of a pelletized shielding composition.

COMPARATIVE EXAMPLE

Compositions similar to those of Example 1 were prepared by varying the conductive carbon black and/or the graphite content as follows. In each instance, the total of the carbon black, graphite and poly(vinyl chloride) was constant with the quantity of the latter being varied in accordance with the change in the conductive particle content.

With the conductive carbon black remaining constant at 13.5 parts, formulations were prepared containing 5 and 15 parts, respectively, of graphite.

With the graphite remaining constant at 10 parts, formulations were prepared containing 10 and 15 parts, respectively, of conductive carbon black.

Formulations were prepared which contained no graphite wherein the conductive carbon black content was 3.5, 8, 12 and 15 parts, respectively.

The shear stress of each of the formulations was measured. The degree of EMI shielding provided by a 0.156 inch thick molded sheet of the formulation was also determined. In each instance, a linear plot can be drawn from the results. The formulation containing only carbon black showed an increase in shear stress, which correlates to an increase in melt viscosity, of over 100 percent with an increase in shielding power of only 7 dB, i.e. from 25 to 32 dB.

Adding various quantities of carbon black to a constant graphite content also produced an increase in shear stress in excess of 100 percent. The increase in shielding was from 35 dB for 10 parts of carbon black to 54 dB for 15 parts carbon black The increase in shear stress produced by adding graphite to a constant carbon black content was only about 20 percent. The increase in shielding protection, however, was from 23 dB to 34 dB, i.e. 50 percent. This data clearly shows the unexpected efficiency of the compositions of this invention. This test was conducted utilizing substantially thinner sheets of shielding material, i.e. sheets having a thickness of only 0.07 inch.

EXAMPLE 2

In order to determine the absorptive capability of the subject shielding compositions, a cross section of a standard waveguide was covered with two panels of test material. Utilizing a uniform $TE_{10}$ mode of microwave energy through the waveguide, the panels were precisely separated to create a slot across the center and parallel to the broad wall of the waveguide.

The slot in the waveguide was gradually widened and the insertion loss measured. The insertion loss is the relative amount of energy passing the panel. The materials utilized were panels of polished brass, which represents total reflectance, and a formulation preferred according to Example 1 containing 13.5 percent of carbon black and 5 percent of graphite. It was not necessary to measure a panel representative of total absorbance since the electric field was uniform across the slot and, therefore, the insertion loss was directly related to the size of the slot and could be readily calculated.

The results showed the composition of this invention to be significantly closer to total absorptance than total reflectance. A similar formulation containing only carbon black likewise favored total absorptance, but by a small degree. The brass panels were effective at 25 dB only at virtually zero slot. The carbon black only formulation did not reach 25 dB even at zero slot. The subject formulation, however, provided 25 dB shielding at a 0.02 inch slot. This is a significant opening. This means that effective shielding housing can be made from the subject compositions without overlapping and/or gaskets in the seams. At a slot of 0.04 inch, the brass panel had lost just over half of its effectiveness, whereas the formulation containing only carbon black had lost just over one-third and the carbon black/graphite formulation of this invention had lost just under one-third. The panels of the subject composition still retained over one-half efficiency with a slot of 0.08 inch, a significant advantage over conventional shielding materials.

We claim:

1. A homogeneous composition suitable for shielding an electronic device from electromagnetic and radio frequency interference consisting of: from about 64 to about 78 percent by weight of a vinyl chloride-based resin; a conductive component comprising from about 10 to about 17 percent by weight of finely divided conductive carbon black and from about 5 to about 15 percent by weight of graphite, and up to about 10 percent by weight of additives compatible therewith comprising at least a stabilizer and a lubricant.

2. A composition in accordance with claim 1, wherein the vinyl chloride-based resin is poly(vinyl chloride).

3. A composition in accordance with claim 1 wherein the composition comprises from about 66 to about 72 percent by weight of the thermoplastic resin, from about 12 to about 16 percent by weight of conductive carbon black, about 10 percent by weight of graphite, and up to about 10 percent by weight of the additives.

4. A composition in accordance with claim 1, wherein the conductive carbon black has an apparent bulk density of about 150 grams per liter and a particle size under 45 nanometers.

5. A composition in accordance with claim 4, wherein the conductive carbon black has a particle size of under 25 nanometers.

6. A composition in accordance with claim 1, wherein the additives present in said composition comprise a stabilizer, at least two lubricants, a processing aid and a plasticizer.

7. A composition in accordance with claim 6, wherein the stabilizer is an organo-tin compound, one of the lubricants is stearic acid, a salt thereof or an ester thereof, and the plasticizer is diundecyl phthalate.

8. A method of shielding an electronic device from electromagnetic and radio frequency interference comprising coating the enclosure of said device where shielding is required with an effective amount of the composition of claim 1.

9. A method in accordance with claim 8, wherein a sufficient amount of said composition is coated onto the device enclosure to provide at least about 30 dB shielding.

* * * * *